United States Patent
Luo et al.

(10) Patent No.: US 11,469,395 B2
(45) Date of Patent: Oct. 11, 2022

(54) ROLLABLE DISPLAY DEVICE

(71) Applicant: BOE TECHNOLOGY GROUP CO., LTD., Beijing (CN)

(72) Inventors: Xiaofei Luo, Beijing (CN); Shangchieh Chu, Beijing (CN); Hong Zhu, Beijing (CN); Yanyan Yang, Beijing (CN); Baofeng Sun, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/048,705

(22) PCT Filed: Apr. 24, 2020

(86) PCT No.: PCT/CN2020/086606
§ 371 (c)(1),
(2) Date: Oct. 19, 2020

(87) PCT Pub. No.: WO2020/216318
PCT Pub. Date: Oct. 29, 2020

(65) Prior Publication Data
US 2021/0242420 A1     Aug. 5, 2021

(30) Foreign Application Priority Data
Apr. 25, 2019    (CN) .......................... 201910336897.8

(51) Int. Cl.
*H05K 7/02* (2006.01)
*H05K 7/04* (2006.01)
(Continued)

(52) U.S. Cl.
CPC ........ *H01L 51/524* (2013.01); *H01L 51/0097* (2013.01); *H05K 5/0017* (2013.01); *H05K 5/0217* (2013.01); *H01L 2251/5338* (2013.01)

(58) Field of Classification Search
USPC ........................................ 361/807, 728, 810
See application file for complete search history.

(56) References Cited

U.S. PATENT DOCUMENTS

2004/0183958 A1* 9/2004 Akiyama ................. G09F 9/30
                                                                349/58
2007/0241002 A1  10/2007 Wu et al.
(Continued)

FOREIGN PATENT DOCUMENTS

CN     104937654 A    9/2015
CN     106097896 A   11/2016
(Continued)

OTHER PUBLICATIONS

First Office Action dated Jul. 8, 2020 for application No. CN201910336897.8 with English translation attached.
(Continued)

*Primary Examiner* — Hung S. Bui
(74) *Attorney, Agent, or Firm* — Nath, Goldberg & Meyer; Joshua B. Goldberg (57) ABSTRACT

The present disclosure discloses a rollable display device, including: a flexible display panel; a reel connected to one end of the flexible display panel, around which the flexible display panel is rollable and extendable; a support structure arranged on two side edges of the flexible display panel in a rolling direction thereof, and provided with a first fixing portion; wherein the reel is provided with a second fixing portion matched with the first fixing portion for fixing the support structure and the reel when the flexible display panel is rolled.

8 Claims, 6 Drawing Sheets

(51) Int. Cl.
*H01L 51/52* (2006.01)
*H01L 51/00* (2006.01)
*H05K 5/00* (2006.01)
*H05K 5/02* (2006.01)

(56) References Cited

U.S. PATENT DOCUMENTS

| | | | | |
|---|---|---|---|---|
| 2008/0247126 | A1* | 10/2008 | Otsuka | G06F 1/1601 |
| | | | | 361/679.06 |
| 2016/0105791 | A1* | 4/2016 | Wang | H04W 72/0466 |
| | | | | 370/335 |
| 2016/0120023 | A1* | 4/2016 | Choi | H05K 1/028 |
| | | | | 29/829 |
| 2016/0320804 | A1* | 11/2016 | Takayanagi | G06F 1/1615 |
| 2017/0212556 | A1* | 7/2017 | Jovanovic | H01L 51/5237 |

FOREIGN PATENT DOCUMENTS

| | | |
|---|---|---|
| CN | 107230429 A | 10/2017 |
| CN | 109872639 A | 6/2019 |
| KR | 20140045024 A | 4/2014 |
| KR | 20140054498 A | 5/2014 |
| KR | 20140066064 A | 5/2014 |
| KR | 20140101124 A | 8/2014 |
| KR | 20150007274 A | 1/2015 |
| KR | 20150007275 A | 1/2015 |

OTHER PUBLICATIONS

Second Office Action dated Nov. 6, 2020 for application No. CN201910336897.8 with English translation attached.

\* cited by examiner

ROLLABLE DISPLAY DEVICE

CROSS REFERENCE TO RELATED APPLICATIONS

This is a National Phase Application filed under 35 U.S.C. 371 as a national stage of PCT/CN2020/086606, filed on Apr. 24, 2020, an application claiming priority from Chinese patent application No. 201910336897.8 filed on Apr. 25, 2019 to the Chinese Intellectual Property Office, the contents of which are incorporated herein by reference in their entirety.

TECHNICAL FIELD

The present disclosure relates to the field of display technologies, and particularly relates to a rollable display device.

BACKGROUND

Organic Light-Emitting Diodes (OLEDs) use organic polymer materials which emit light when current flows through as the semiconductor materials in the light emitting diodes. The OLED display technology has the characteristics of self-luminescence, as well as wide viewing angle, high contrast, low energy consumption and the like. By manufacturing an OLED on a flexible base substrate based on the characteristics thereof, and then fabricating a thin film encapsulation layer on the OLED to block water and oxygen, a flexible display panel can be manufactured. Meanwhile, the OLED flexible display panel reduces use of the backlight, thickness of the display panel, as well as weight of the display device.

As market demands for flexible displays increase, research and development of various flexible display devices, such as rollable display devices that have already been developed and used, has gained more and more attention. An extended flexible display panel may be used to increase visibility, while a rolled flexible display panel has a smaller volume and is more portable.

In use of the rollable flexible display device, edges of a flexible display screen tend to be misplaced and damaged when the flexible display screen needs to be rolled, and the problems of curling and loosening may easily occur.

SUMMARY

The present disclosure mainly provides the following technical solutions:

In one aspect, an embodiment of the present disclosure provides a rollable display device, characterized in including: a flexible display panel; a reel connected to one end of the flexible display panel, around which the flexible display panel is rollable and extendable; a support structure arranged on two side edges of the flexible display panel in a rolling direction thereof, and provided with a first fixing portion; wherein the reel is provided with a second fixing portion matched with the first fixing portion for fixing the support structure and the reel when the flexible display panel is rolled.

Optionally, the support structure is configured as a strip structure, and is arranged around the two side edges of the flexible display panel.

Optionally, the support structure is continuously arranged on the two side edges of the flexible display panel in the rolling direction, or the support structure is arranged at intervals on the two side edges of the flexible display panel in the rolling direction.

Optionally, the support structure includes a support protective layer and a flexible cover arranged on the support protective layer in a stacked mode; wherein the support protective layer is made of a flexible material with preset elasticity.

Optionally, the support protective layer in the support structure has an elastic modulus gradually increased from a first end to a second end of the support structure; wherein the first end of the support structure is an end close to the reel.

Optionally, the second fixing portion includes protruding structures arranged at two ends of the reel and uniformly distributed around a circumference of the reel; and the first fixing portion includes a plurality of through holes arranged on the support structure and matched with the protruding structures.

Optionally, a distance between adjacent through holes on a first side of a preset position on the support structure is smaller than a distance between adjacent through holes on a second side of the preset position; wherein the preset position is a position at which a rolling radius of the flexible display panel is increased, the first side of the preset position is a side of the preset position close to the reel, and the second side of the preset position is a side of the preset position away from the reel.

Optionally, each of the protruding structures has a diameter gradually reduced from a first end to a second end thereof; wherein the first end of the protruding structure is an end connected to the reel.

Optionally, each of the through holes on the first side of the preset position on the support structure has a size larger than a corresponding through hole on the second side of the preset position.

Optionally, the flexible display panel includes a flexible substrate, and a light emitting layer and the flexible cover which are sequentially stacked on the flexible substrate; wherein the flexible cover has a thickness not less than the flexible substrate.

Optionally, the flexible display panel and the support structure have the same thickness.

In the rollable display device proposed in the embodiment of the disclosure, the support structure has a function of supporting and protecting positions at edges of the flexible display panel, thereby reducing damages to edges of the flexible display panel in use, while the first fixing portion provided on the support structure and the second fixing portion provided on the reel and matched with the first fixing portion may fix the support structure to the reel when the flexible display panel is rolled so that the flexible display panel is rolled compactly to be closely bonded with the reel, thereby avoiding the problems of misplacement and easy loosening during rolling of the flexible display screen and thus effectively protecting the flexible display panel.

DETAILED DESCRIPTION OF THE EMBODIMENTS

To further illustrate the technical means and effects of the present disclosure for achieving the intended objects of the disclosure, the rollable display device according to the present disclosure and specific implementations, structures, features and effects thereof will be explained in detail below with reference to the accompanying drawings and preferred embodiments.

As shown in FIGS. 1 to 8, in an embodiment of the present disclosure, there is provided a rollable display device, including: a flexible display panel 1; a reel 2 connected to one end of the flexible display panel 1, around which the flexible display panel 1 is rollable and extendable; a support structure 3 arranged on two side edges of the flexible display panel 1 in a rolling direction thereof, and provided with a first fixing portion 4; wherein the reel 2 is provided with a second fixing portion 5 matched with the first fixing portion 4 for fixing the support structure 3 and the reel 2 when the flexible display panel 1 is rolled.

Specifically, the flexible display panel 1 is a flexible rollable display panel, which has one end connected to the reel 2 and is rollable and extendable around a circumferential surface of the reel 2. For convenience of description, referring to FIG. 1, the support structure 3 is provided on two sides of the flexible display panel 1 in the rolling direction thereof, i.e., on the front and back sides perpendicular to the rolling direction of the flexible display panel 1, and plays a role in supporting and protecting edges of the flexible display substrate. The specific arrangement manner of the support structures 3 on two sides of the flexible display panel 1 may vary, so as to effect the function of supporting and protecting positions at edges of the flexible display panel 1, and facilitate provision of the first fixing portion 4. For example, the support structure 3 may be configured as a strip structure, and to be completely bonded and connected to the two side edges of the flexible display panel 1. The support structure 3 and the flexible display panel 1 may each have a top layer of the flexible cover 31 structure, i.e., a structure that can connect the flexible display panel 1 and the support structure 2 into an integrated structure. The first fixing portion 4 is provided on the support structure 3, and in order to realize fixed connection between the support structure 3 and the reel 2 when the flexible display panel 1 is rolled, the second fixing portion 5 matched with the first fixing portion 4 should be provided at two ends of the reel. To ensure the bonding effect of the support structure 3 and the reel 2, a plurality of first fixing portions 4 and a plurality of second fixing portions 5 may be provided, wherein the plurality of second fixing portions 5 may be uniformly distributed on the circumferential surface of the reel 2 at two ends, while the corresponding plurality of first fixing portions 4 may be distributed on corresponding positions of the support structure 3. The first fixing portions 4 and the second fixing portions 5 may be arranged in various specific manners, for example: the second fixing portions 5 may be provided as positioning protrusions, the first fixing portions 4 may be provided as positioning holes, and the connection between the first fixing portions 4 and the second fixing portions 5 is effected by inserting the positioning protrusions into respective positioning holes, or the first fixing portions 4 and the second fixing portions 5 may be arranged differently as long as the support structure 3 and the reel 2 are closely connected and no misplacement or loosening occurs during the rolling.

In the rollable display device proposed in the embodiment of the disclosure, the support structure has a function of supporting and protecting positions at edges of the flexible display panel, thereby reducing damages to edges of the flexible display panel in use, while the first fixing portion provided on the support structure and the second fixing portion provided on the reel and matched with the first fixing portion may fix the support structure to the reel when the flexible display panel is rolled so that the flexible display panel is rolled compactly to be closely bonded with the reel, thereby avoiding the problems of misplacement and easy loosening during rolling of the flexible display screen and thus effectively protecting the flexible display panel.

Figure 2:
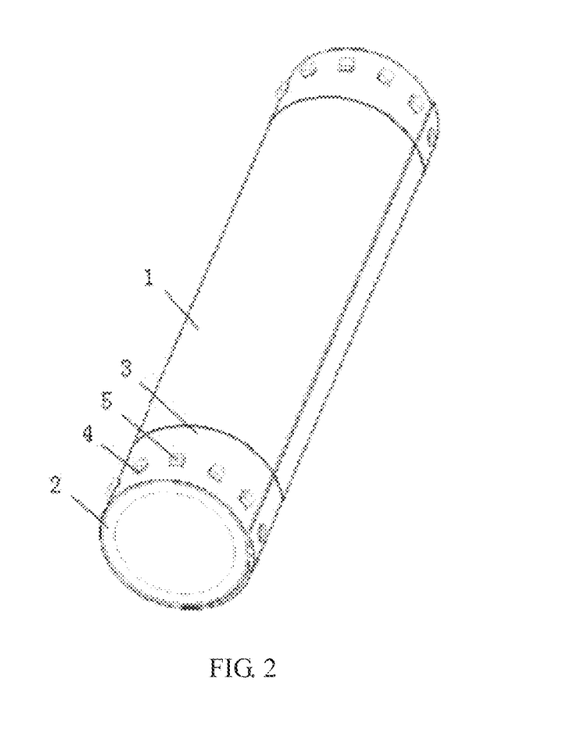
FIG. 2 is a schematic structural diagram showing a rollable display device according to an embodiment of the disclosure in a rolled state.
Figure 3:
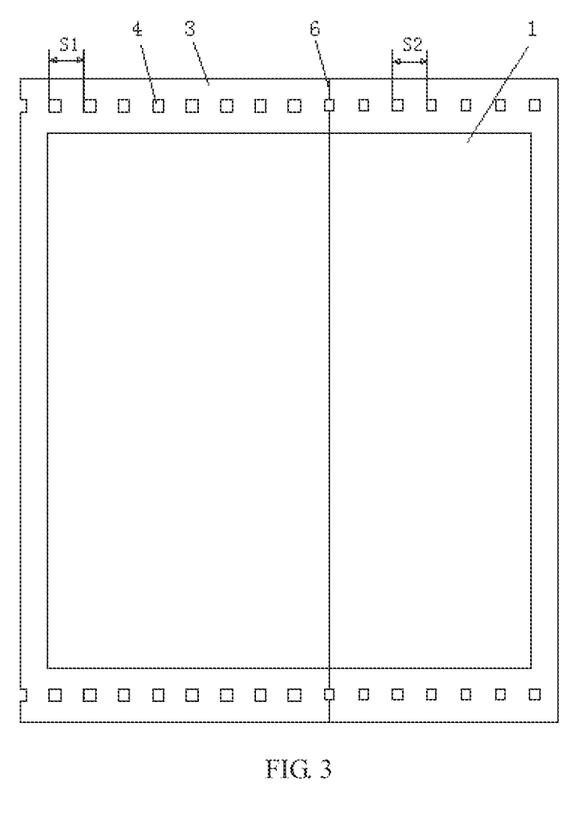
FIG. 3 is a schematic structural diagram showing a support structure of a rollable display device according to an embodiment of the disclosure.
Figure 4:
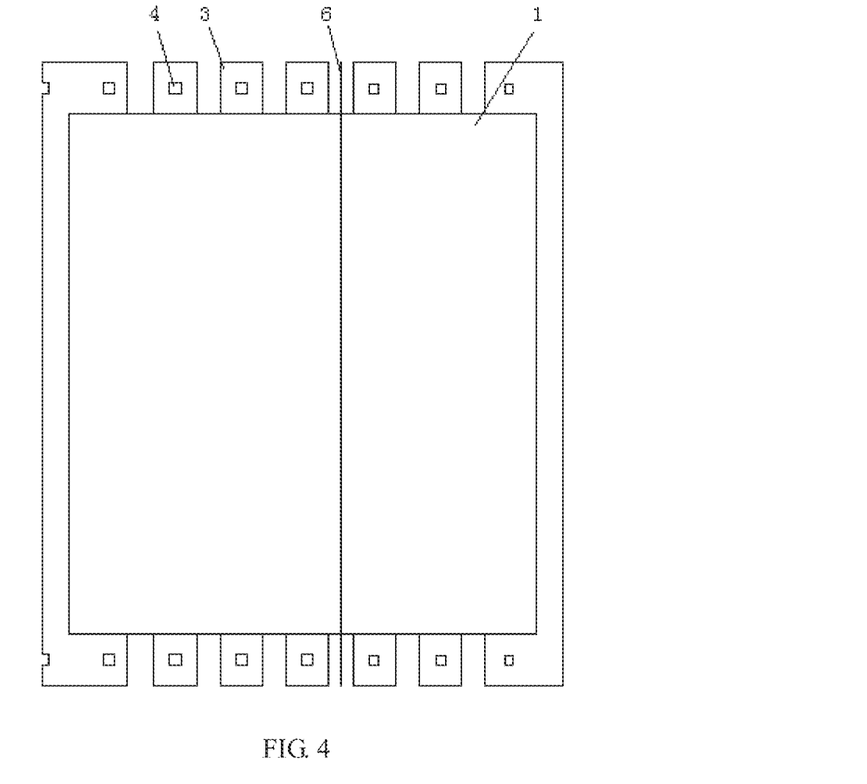
FIG. 4 is a schematic structural diagram showing a support structure of another rollable display device according to an embodiment of the disclosure.
Figure 5:
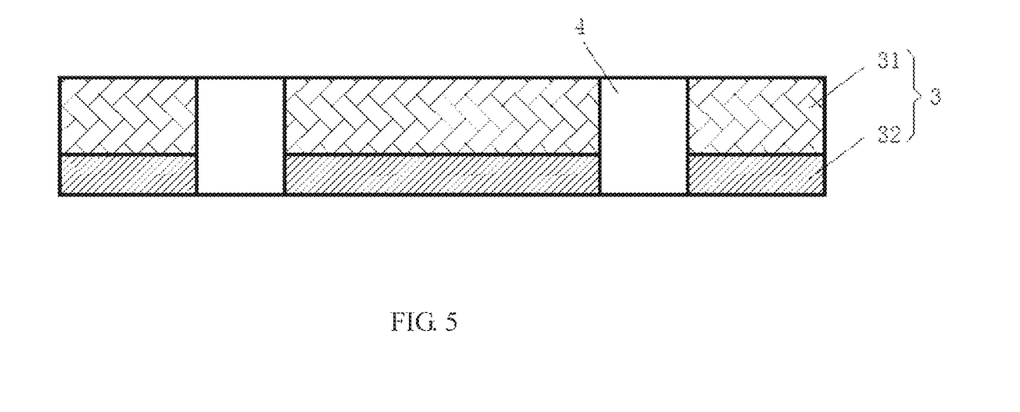
FIG. 5 is a schematic structural diagram showing a support structure of a rollable display device according to an embodiment of the disclosure.
Figure 6:
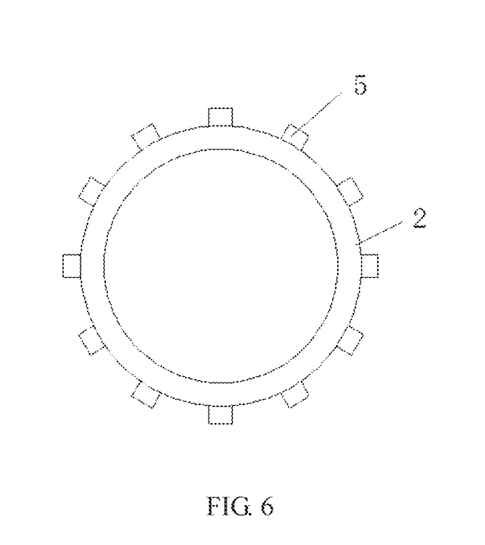
FIG. 6 is a schematic structural diagram showing a reel of a rollable display device according to an embodiment of the disclosure.

The support structure 3 may have various specific forms. Specifically, as shown in FIGS. 2 and 3, the support structure 3 may be configured as a strip structure, and arranged around the two side edges of the flexible display panel 1. Based on aesthetic considerations and regularity of the display device, the support structure 3 may be configured as a strip structure so that the support structure 3 is arranged around the two side edges of the flexible display panel 1 and wraps the flexible display panel 1 inside, thereby reliably protecting edge portions of the flexible display panel 1. Specifically, the strip support structure 3 may have a length equal to the two side edges of the flexible display panel 1, as shown in FIG. 2, that is, the support structure is continuously arranged on the two side edges of the flexible display panel in the rolling direction. Alternatively, as shown in FIG. 3, the strip support structure 3 may have a length smaller than the two side edges of the flexible display panel 1. In this case, a plurality of supporting structures 3 may be provided around the two side edges of the flexible display panel 1 in the rolling direction thereof at intervals, that is, the support structure is arranged at intervals on the two side edges of the flexible display panel in the rolling direction, which can also have a protecting function for the edges of the flexible display panel 1 while reducing the material required for manufacturing and the overall weight of the display device. When a plurality of supporting structures 3 are provided, the number and positions of the supporting structures 3 may depend on the arrangement manner and positions of the first fixing portions 4.

Figure 8:
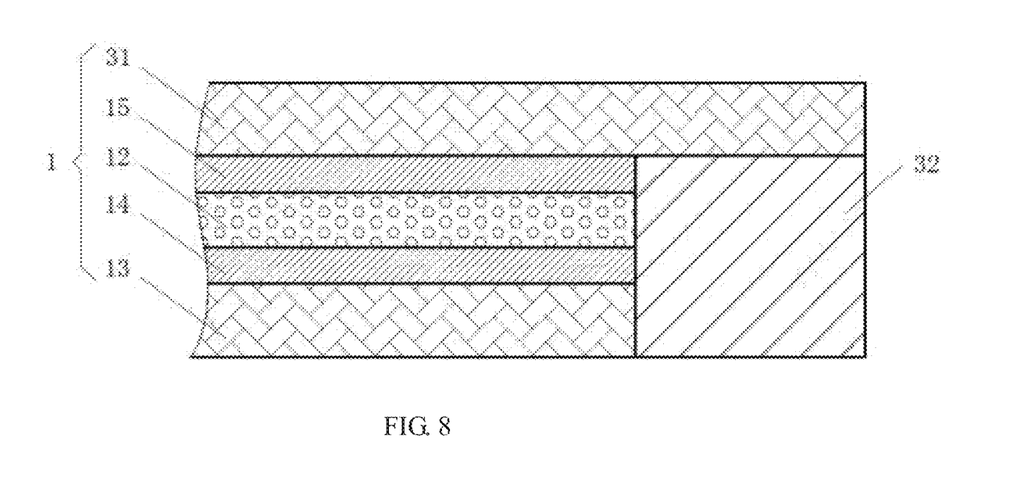
FIG. 8 is a schematic structural diagram showing a flexible display panel of another rollable display device according to an embodiment of the disclosure.

As shown in FIG. 8, the support structure 3 includes a support protective layer 32 and a flexible cover 31 arranged on the support protective layer 32 in a stacked mode; wherein the support protective layer 32 is made of a flexible material with preset elasticity. Specifically, the flexible cover 31 may form an integrated structure with the flexible cover 31 on an upper layer of the flexible display panel 1, and have a lower side forming a support protective layer 32 made of a flexible material, so as to cooperate with the flexible rolling function of the flexible display panel 1. The support protective layer 32 is made of a material with preset elasticity, that is, the support protective layer 32 has good elasticity so that the support protective layer 32 can provide support for the flexible display panel 1 in use of the flexible display device, thus helping to improve support at edges of the flexible display panel 1. The support protective layer 32 may be made of a foam material which has good elasticity, free bending and light weight, and is beneficial to meeting the light weight requirement of the display device.

The support protective layer 32 in the support structure 3 has an elastic modulus gradually increased from a first end to a second end of the support structure; wherein the first end of the support structure 3 is an end close to the reel. Currently, a rolling moment is typically provided by a torsion spring structure when a rollable flexible display screen is rolled, wherein when the flexible display panel 1 is rolled for a first turn, the torsion spring of the reel 2 has a large torque, which tends to damage a part of the edges of the flexible display panel 1 close to the reel 2, while toward the end of the reel, the torsion spring torque of the reel 2 becomes smaller and requires sufficient support from the flexible display panel 1. Therefore, by providing the elastic modulus of the support protective layer 32 in the support structure 3 gradually increased from one end close to the reel 2, to the outermost end away from the reel 2, the first end, i.e., the end close to the reel 2, of the support structure 3 has a low elastic modulus, and the support structure has low rigidity and good flexibility and thus can be easily deformed, thereby preventing excessive pressure on the flexible display panel 1 and facilitating protection of the flexible display panel 1. In contrast, the second end, i.e., the end away from the reel 2, of the support structure 3 has higher elastic modulus and rigidity and thus cannot be easily deformed so that the support for edges of the flexible display panel 1 can be improved under the action of a smaller torque.

Figure 1:
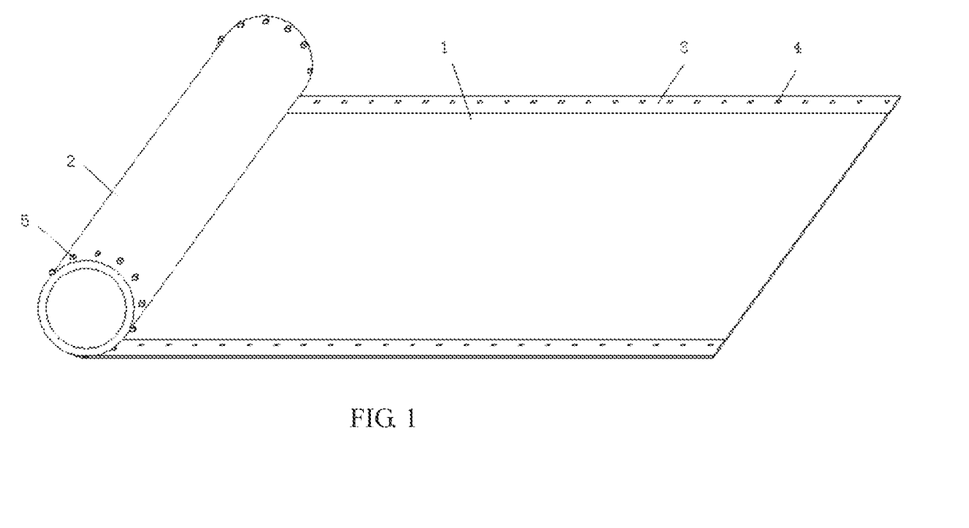
FIG. 1 is a schematic structural diagram showing a rollable display device according to an embodiment of the disclosure in an extended state.
Figure 7:
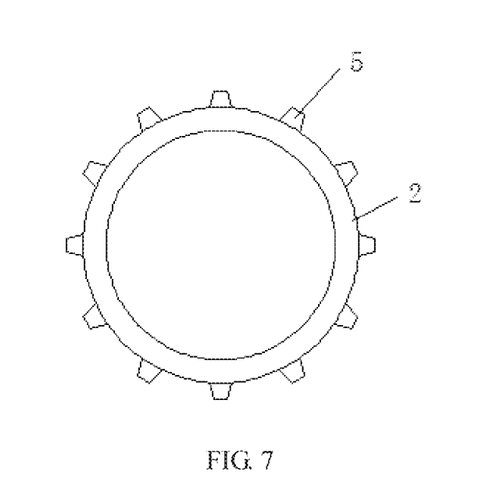
FIG. 7 is a schematic structural diagram showing a reel of another rollable display device according to an embodiment of the disclosure.

The first fixing portion 4 and the second fixing portion 5 described above may have various specific forms. Specifically, as shown in FIGS. 1 to 7, the second fixing portion 5 includes protruding structures arranged at two ends of the reel 2 and uniformly distributed around a circumference of the reel 2; and the first fixing portion 4 includes a plurality of through holes arranged on the support structure 3 and matched with the protruding structures. The second fixing portion 5 may be configured as a protruding structure, and in order to increase bonding between the support structure 3 and the reel 2, a plurality of protruding structures may be uniformly distributed on the circumferential surface of the reel 2. The protruding structure may be a rectangular block protrusion (as shown in FIGS. 1 and 2), a cylindrical protrusion, a hemispherical protrusion, a prismoid protrusion (as shown in FIG. 7), or the like, which is not limited herein. The corresponding first fixing portion 4 cooperated with the second fixing portion 5 may be configured as a through hole, and likewise, a plurality of through holes may be provided. The specific number of the through holes may depend on the number of the protruding structures and turns of the flexible display panel 1, and a distance between adjacent through holes may depend on the rolled state and a distance between adjacent protruding structures. The through hole may be shaped and sized according to the shape and size of a sectional shape of the protruding structure. For example, as shown in FIGS. 1 to 4, when the protruding structure is configured as a rectangular protrusion, the through hole may be configured as a rectangular through hole, or when the protruding structure is configured as a cylindrical protrusion, the through hole may be configured as a circular through hole. The first fixing portion 4 can be matched with the second fixing portion 5 properly so that compactness of the connection between the flexible display panel 1 and the reel 2 after rolling can be improved. In addition, the second fixing portions 5 may be configured as through holes located at two ends of the reel and uniformly distributed around a circumference of the reel 2, while the corresponding first fixing portion 4 is configured on the support structure 3 as protruding structures that can be matched with the through holes. Therefore, the first fixing portion 4 can be reliably connected to the second fixing portion 5, and compactness of the connection between the flexible display panel 1 and the reel 2 after rolling is guaranteed as long as the flexible display panel 1 is not easy to be misplaced or loosened.

Specifically, as shown in FIG. 3, a distance S1 between adjacent through holes on a first side of a preset position 6 on the support structure 3 is smaller than a distance S2 between adjacent through holes on a second side of the preset position 6; wherein the preset position 6 is a position at which a rolling radius of the flexible display panel 1 is increased, the first side of the preset position 6 is a side of the preset position close to the reel 2, e.g., the left side of the preset position 6 in FIG. 3, and the second side of the preset position 6 is a side of the preset position away from the reel 2, e.g., the right side of the preset position 6 in FIG. 3. During rolling of the flexible display panel 1, depending on the rolling turns, a position with an increased rolling radius occurs each time a rolling turn is added, and by providing the preset position 6 as a position with an increased rolling radius on the flexible display panel 1, in order to ensure that the through hole on the support structure 3 can be better matched and fixed with the protruding structure on the reel 2 as the rolling radius of the flexible display panel 1 is increased, a properly increased distance S2 between the adjacent through holes on the second side of the preset position 6 can facilitate rolling of the flexible display panel 1 with the increased rolling radius, reduce the external force effect on the flexible display panel 1 during the rolling to protect the flexible display panel 1, prevent different turns of the flexible display panel 1 from being tightly bonded together after the rolling, and reduce damages caused by the friction between turns of the flexible display panel 1 by providing a certain interval between every two turns of the flexible display panel 1.

The protruding structure as described above may have various specific forms. Specifically, as shown in FIG. 7, each of the protruding structures has a diameter gradually reduced from a first end to a second end thereof; wherein the first end of the protruding structure is an end connected to the reel 2. Each of the protruding structures has a diameter gradually reduced from the end connected with the reel 2 to an outer end, for example: the protruding structure may be configured as a truncated cone protrusion, a prismoid protrusion or the like. Correspondingly, each of the through holes on the first side of the preset position 6 on the support structure 3 has a size larger than a corresponding through hole on the second side of the preset position 6. The preset position 6 is a position at which a rolling radius of the flexible display panel 1 is increased, and by providing the through hole on the second side of the preset position 6 having a reduced size relative to the through hole on the first side of the preset position 6 and by cooperating with the protruding structure having a diameter gradually reduce from the first end to the second end, a proper distance is reserved between adjacent turns of the flexible display panel 1 when the flexible display panel 1 is rolled so that the friction between the flexible cover 31, the flexible substrate 13 and a backing film of adjacent turns of the flexible display panel 1 can be effectively prevented, and thus the flexible display panel 1 can be protected from being damaged.

Figure 9:
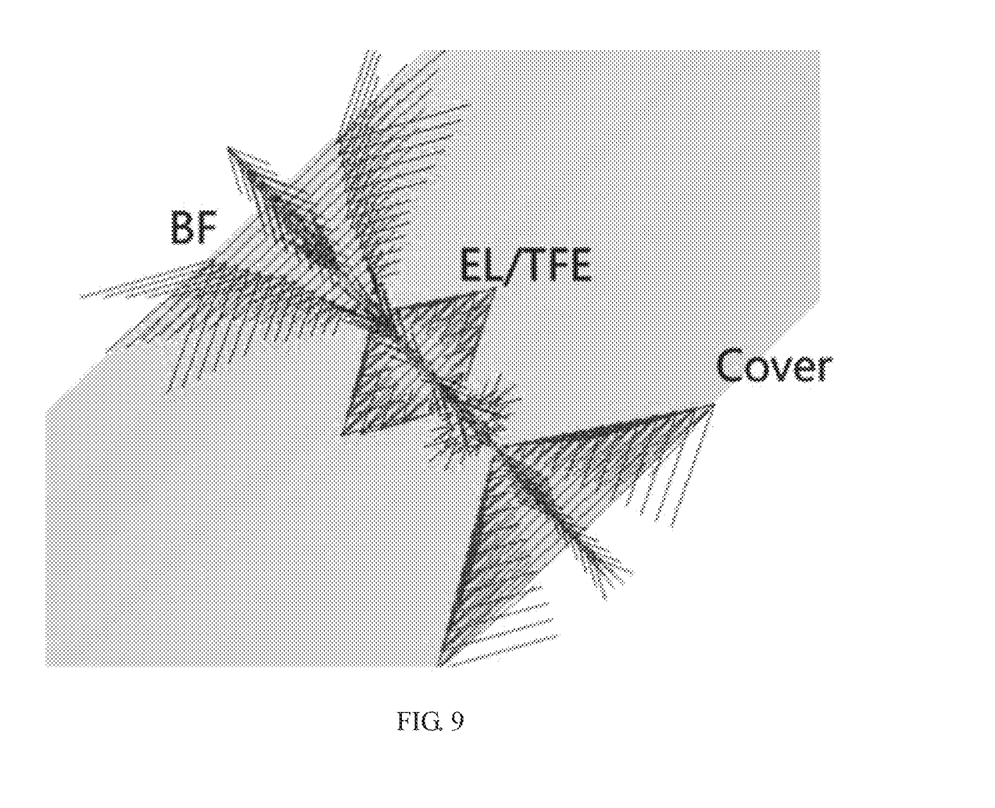
FIG. 9 is a schematic simulation diagram showing a flexible display panel before optimization according to an embodiment of the present disclosure.
Figure 10:
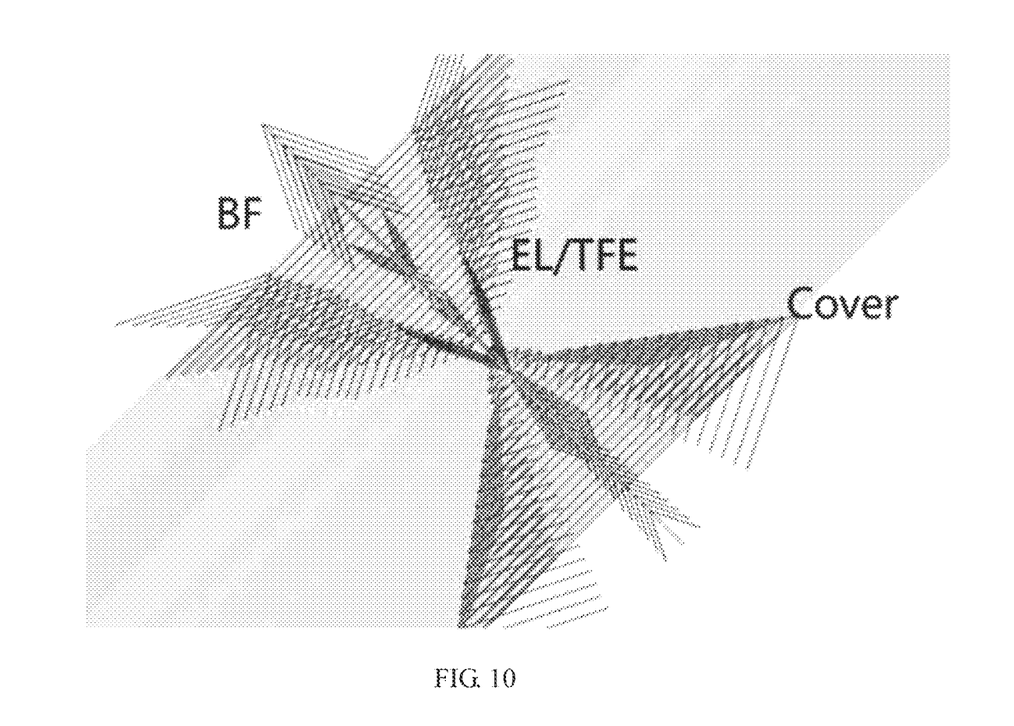
FIG. 10 is a schematic simulation diagram showing a flexible display panel after optimization according to an embodiment of the present disclosure.

Specifically, as shown in FIG. 8, the flexible display panel 1 includes a flexible substrate 13, and a light emitting layer 12 and the flexible cover 31 which are sequentially stacked on the flexible substrate 13; wherein the flexible cover has a thickness not less than the flexible substrate. The flexible display panel 1 adopts a thin film layer structure, including a flexible substrate 13, a light emitting layer 12 and a flexible cover 31, wherein the flexible cover 31 on the top layer of the flexible display panel 1 and the flexible cover 31 on the upper layer of the support structure 3 may be the same one and form an integrated structure. The flexible display panel 1 is connected to the support structure 3, the light emitting layer 12 is provided with an OLED light emitting device, and the flexible substrate 13 is a substrate of the flexible display panel 1. Adjacent film layers are connected by adhesive layers, wherein a first adhesive layer 14 is provided between the flexible substrate 13 and the light emitting layer 12, and a second adhesive layer 15 is provided between the light emitting layer 12 and the flexible cover 31. The first adhesive layer 14 and the second adhesive layer 15 are made of the same adhesive material and have the same thickness, while it is ensured that the flexible cover 31 has a thickness not less than the flexible substrate 12 so that a neutral layer is located in the EL layer or TFE layer of the light emitting layer 12. During rolling of the flexible display panel 1, an inner layer is extruded, an outer layer is stretched, and the neutral layer is a transition layer which is subjected to no or little tensile stress or compressive stress so that the light emitting layer 12 is subjected to smaller stress strain during the rolling, thereby providing protection for the OLED light emitting device in the light emitting layer 12. Simulation analysis of the flexible display panel 1 provided in the embodiment before optimization by Ansys Workbench is shown in FIG. 9, and simulation analysis of the flexible display panel 1 provided in the embodiment is shown in FIG. 10 that shows stress simulation of the flexible substrate 13 (BF), the light emitting layer (EL/TFE) and the flexible cover 31 (Cover). FIG. 9 shows that the EL layer and the TFE layer in the light emitting layer 12 are both subjected to a higher stress (tensile stress) and tend to be damaged during rolling, which is not beneficial to rolling, while in FIG. 10, the neutral layer is located in the TFE layer in the light emitting layer 12, and the EL layer is also subjected to a lower stress (compressive stress). Based on simulation analysis, the flexible display panel 1 of this embodiment has a structure in which the stress is reduced by 22% compared with the structure before optimization, thereby improving the rollability of the flexible display panel 1.

Specifically, the flexible display panel 1 and the support structure 3 may have the same thickness. In manufacturing, the flexible cover 31 on the top layer of the flexible display panel 1 and the flexible cover 31 on the upper layer of the support structure 3 may be the same one and form an integrated structure, the flexible display panel 1 is connected to the support structure 3, and the support protective layer 32 in the support structure 3 is configured to have a thickness equal to a total thickness of other film layers in the flexible display panel 1 so that the flexible display panel 1 and the support structure 3 form a structure having an upper surface and a lower surface in same horizontal plane, and so that the flexible display panel 1 and the support structure 3 form an integrated structure that can facilitate rolling of the flexible display panel 1 and enhance the support and protection for the flexible display panel 1 by the support structure 3.

The foregoing are merely specific implementations of the present disclosure, but the protection scope of the disclosure is not limited thereto. Any change or alternative that can be easily thought by those skilled in the art within the technical scope disclosed by the disclosure shall fall in the protection scope of the disclosure. Therefore, the scope of protection of the present disclosure shall be determined by the scope of the claims.

What is claimed is:

1. A rollable display device comprising:
   a flexible display panel;
   a reel connected to one end of the flexible display panel, around which the flexible display panel is rollable and extendable;
   a support structure arranged on two side edges of the flexible display panel in a rolling direction, and provided with a first fixing portion;
   wherein the reel is provided with a second fixing portion matched with the first fixing portion for fixing the support structure and the reel when the flexible display panel is rolled, wherein
   the support structure is configured as a strip structure, and is arranged around the two side edges of the flexible display panel,
   the support structure is continuously arranged on the two side edges of the flexible display panel in the rolling direction, or the support structure is arranged at intervals on the two side edges of the flexible display panel in the rolling direction,
   the support structure comprises a support protective layer and a flexible cover arranged on the support protective layer in a stacked mode; and
   the support protective layer is made of a flexible material with preset elasticity.

2. The rollable display device according to claim 1, wherein
   the support protective layer in the support structure has an elastic modulus gradually increased from a first end to a second end of the support structure; and
   the first end of the support structure is an end close to the reel.

3. The rollable display device according to claim 1, wherein
   the second fixing portion comprises protruding structures arranged at two ends of the reel and uniformly distributed around a circumference of the reel; and
   the first fixing portion comprises a plurality of through holes arranged on the support structure and matched with the protruding structures.

4. The rollable display device according to claim 3, wherein
   a distance between adjacent through holes on a first side of a preset position on the support structure is smaller than a distance between adjacent through holes on a second side of the preset position; and
   the preset position is a position at which a rolling radius of the flexible display panel is increased, the first side of the preset position is a side of the preset position close to the reel, and the second side of the preset position is a side of the preset position away from the reel.

5. The rollable display device according to claim 4, wherein
- each of the protruding structures has a diameter gradually reduced from a first end to a second end of the protruding structure; and
- the first end of the protruding structure is an end connected to the reel.

6. The rollable display device according to claim 5, wherein
- each of the through holes on the first side of the preset position on the support structure has a size larger than each of the through holes on the second side of the preset position.

7. The rollable display device according to claim 1, wherein
- the flexible display panel comprises a flexible substrate, and a light emitting layer and a flexible cover which are sequentially stacked on the flexible substrate; and
- the flexible cover has a thickness not less than the flexible substrate.

8. The rollable display device according to claim 7, wherein
- the flexible display panel and the support structure have the same thickness.

\* \* \* \* \*